US007516040B2

(12) United States Patent
Leute et al.

(10) Patent No.: US 7,516,040 B2

(45) Date of Patent: Apr. 7, 2009

(54) SYSTEM AND METHOD FOR AUTOMATED DETECTION OF PRINTING DEFECTS IN AN IMAGE OUTPUT DEVICE

(75) Inventors: Gerardo Leute, Penfield, NY (US); Judith Vandewinckel, Livonia, NY (US); Stephen J. Nichols, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 640 days.

(21) Appl. No.: 11/116,871

(22) Filed: Apr. 28, 2005

(65) Prior Publication Data

US 2006/0119877 A1 Jun. 8, 2006

Related U.S. Application Data

(60) Provisional application No. 60/632,599, filed on Dec. 2, 2004.

(51) Int. Cl.

*G01R 13/00* (2006.01)
*G01R 13/02* (2006.01)
*G01R 29/26* (2006.01)

(52) U.S. Cl. .......................... 702/166; 702/73; 702/81; 399/15; 399/72; 399/139; 347/129; 347/112; 101/171

(58) Field of Classification Search .................. 702/66, 702/73, 81; 399/15, 14, 72, 139; 347/129, 347/225; 101/171

See application file for complete search history.

(56) References Cited

U.S. PATENT DOCUMENTS

| | | | | |
|---|---|---|---|---|
| 4,868,600 | A | 9/1989 | Hays et al. | |
| 5,311,255 | A * | 5/1994 | Josephson | 399/6 |
| 5,519,497 | A | 5/1996 | Hubble, III et al. | |
| 5,884,118 | A * | 3/1999 | Mestha et al. | 399/15 |
| 6,359,641 | B1 * | 3/2002 | Nacman et al. | 347/235 |
| 6,606,947 | B2 * | 8/2003 | Frossard et al. | 101/484 |
| 6,665,425 | B1 | 12/2003 | Sampath et al. | |
| 6,690,471 | B2 | 2/2004 | Tandon et al. | |
| 6,792,220 | B2 | 9/2004 | Randall et al. | |
| 7,295,349 | B2 * | 11/2007 | Mizes et al. | 358/3.26 |

* cited by examiner

*Primary Examiner*—Edward Raymond
*Assistant Examiner*—Elias Desta
(74) *Attorney, Agent, or Firm*—Duane C. Basch; Basch & Nickerson LLP

(57) ABSTRACT

A system and method for the automated detection of printing defects in an image output device are described, employing an imaging device adjacent a photoresponsive member in the output device, wherein the imaging device generates image signals in response to developed and undeveloped regions on the photoresponsive member to identify defects therein.

20 Claims, 4 Drawing Sheets

SYSTEM AND METHOD FOR AUTOMATED DETECTION OF PRINTING DEFECTS IN AN IMAGE OUTPUT DEVICE

This application claims the benefit of U.S. Provisional Application No. 60/632,599, filed Dec. 2, 2004.

A system and method for automated detection of printing defects in an image output device are described, and more particularly, a system and method employing an imaging member adjacent a photoresponsive member in the output device, wherein the imaging member generates image signals in response to developed and undeveloped regions on the photoresponsive member to identify defects therein.

BACKGROUND AND SUMMARY

Heretofore, several patents have disclosed methods and apparatus for monitoring the development of electrostatic images and control of the development process, the relevant portions of which may be briefly summarized as follows:

U.S. Pat. No. 4,868,600 to Hays et al., issued Sep. 19, 1989, and hereby incorporated by reference in its entirety, discloses the rendering of electrostatic images using scavengeless development.

U.S. Pat. No. 5,519,497 to Hubble, III et al., issued May 21, 1996, teaches a closed loop system, which regulates developability by measuring the density of a powder image developed on a photoconductive surface. This is due to the relative stability of the transfer and fusing processes. The use of densitometers for measuring the optical density of black toner particles is indicated as being known. A sensor capable of measuring reflectivity of toner on a photoreceptor surface to enable high toner developed mass per unit area to be controlled is disclosed.

U.S. Pat. No. 6,690,471 to Tandon et al., issued Feb. 10, 2004, and hereby incorporated by reference in its entirety, discloses an improved plural color spectrophotometer for color correction or color calibration and suitable for use in color processing systems.

U.S. Pat. No. 6,792,220 to Randall et al., issued Sep. 14, 2004, teaches a system and method for determining a plurality of calibration curves for a toner concentration sensor, as well as average and composite calibration curves.

U.S. Pat. No. 6,665,425 to Sampath et al., issued Dec. 16, 2003 and hereby incorporated by reference in its entirety, discloses a system and method for automated, image quality based diagnostics and remediation of document processing systems. The disclosure provides for automated diagnosis, prediction and remediation of failures in document processing systems based on an image quality defect analysis in conjunction with a machine/device data analysis. The systems and methods automatically identify image quality problems in document processing systems, such as analog and digital copiers, printers, scanners, facsimiles, and the like by analyzing specific test patterns via techniques such as image processing and pattern recognition.

It is known, as set forth above in U.S. Pat. No. 4,868,600, to use hybrid scavengeless development (HSD) for the development of latent electrostatic images in reprographic and printing systems. HSD developers generally use a set of wires strung across a development nip to enable scavengeless development. These wires are prone for contamination by fibers and debris contaminating the developer housing. Once contaminated with a fiber or piece of debris, a streak defect will often occur during development of the printed image. The defect is caused by the localized alteration of the electrostatic field about the HSD wires, which in turn is reflected as a streak or similar defect in the developed image. This defect would continue to be printed until the customer inspects the printed output and detects the defect. In large runs, this may lead to substantial quantities of defective prints that would be scrapped.

Fiber and other debris related print defects are an unfortunate side effect of the HSD wires. Streaks, caused by fibers caught on the wires, are readily identified by trained observers, and are believed to be objectionable to customers using HSD based print systems. This disclosure describes using an in-line, real-time scanning system to automatically detect streaks or similar development-related defects. Once detected, the output device print engine would stop and signal that the development system, or HSD wires, needs to be serviced. This corrective action could occur via an internal cleaning system, a customer intervention, or a service call.

A system for the automated detection of printing defects in an image output device, comprising: a photoresponsive member upon which a latent electrostatic image is created in response to an input image; a development system for development of the latent electrostatic image on the photoresponsive member with a marking material of at least one color to produce a developed image for transfer to a substrate; a scanning array, disposed adjacent to the photoresponsive member, for receiving light reflected from the surface of the photoresponsive member and the marking material and generating a plurality of scanned image signals representative thereof; and an image comparer for analyzing the scanned image signals to identify defects in the developed image.

In accordance with another embodiment disclosed herein there is provided a method for the automated detection of printing defects in an image output device, comprising the steps of: developing, on a photoresponsive member, in response to a latent electrostatic image, a developed image for transfer to a substrate; scanning the photoresponsive member for at least a portion of the developed image as the photoresponsive member moves relative to a scanning position, to generate a plurality of scanned image signals representative thereof; and analyzing the scanned image signals to identify defects in the developed image.

In accordance with yet another embodiment disclosed herein there is provided A multipurpose imaging device suitable for producing printed output in response to an input, comprising: an input subsystem; a processor and image storage subsystem; an electrophotographic imaging and development subsystem including a photoresponsive member upon which a latent electrostatic image is created in response to an input image; an output and finishing subsystem including a development system for development of the latent electrostatic image on the photoresponsive member with a marking material to produce a developed image for transfer to a substrate; a scanning array, disposed adjacent to the photoresponsive member, for receiving light reflected from the surface of the photoresponsive member and the marking material and generating a plurality of scanned image signals representative thereof; and an image comparer for analyzing the scanned image signals relative to the input image to identify defects in the developed image One aspect of this disclosure is based on the observation of problems with conventional image output devices, be they reprographic or printing systems—that of a delay in detecting image quality defects until the output pages are reviewed. This aspect is based on the discovery of a technique that alleviates these problems by providing in-line, automated defect detection of developed electrostatic images using scanning devices. This technique can be implemented, for example, by an in-line scanning array suitable for analyzing a developed image relative to the input image being printed.

DETAILED DESCRIPTION

Figure 1:
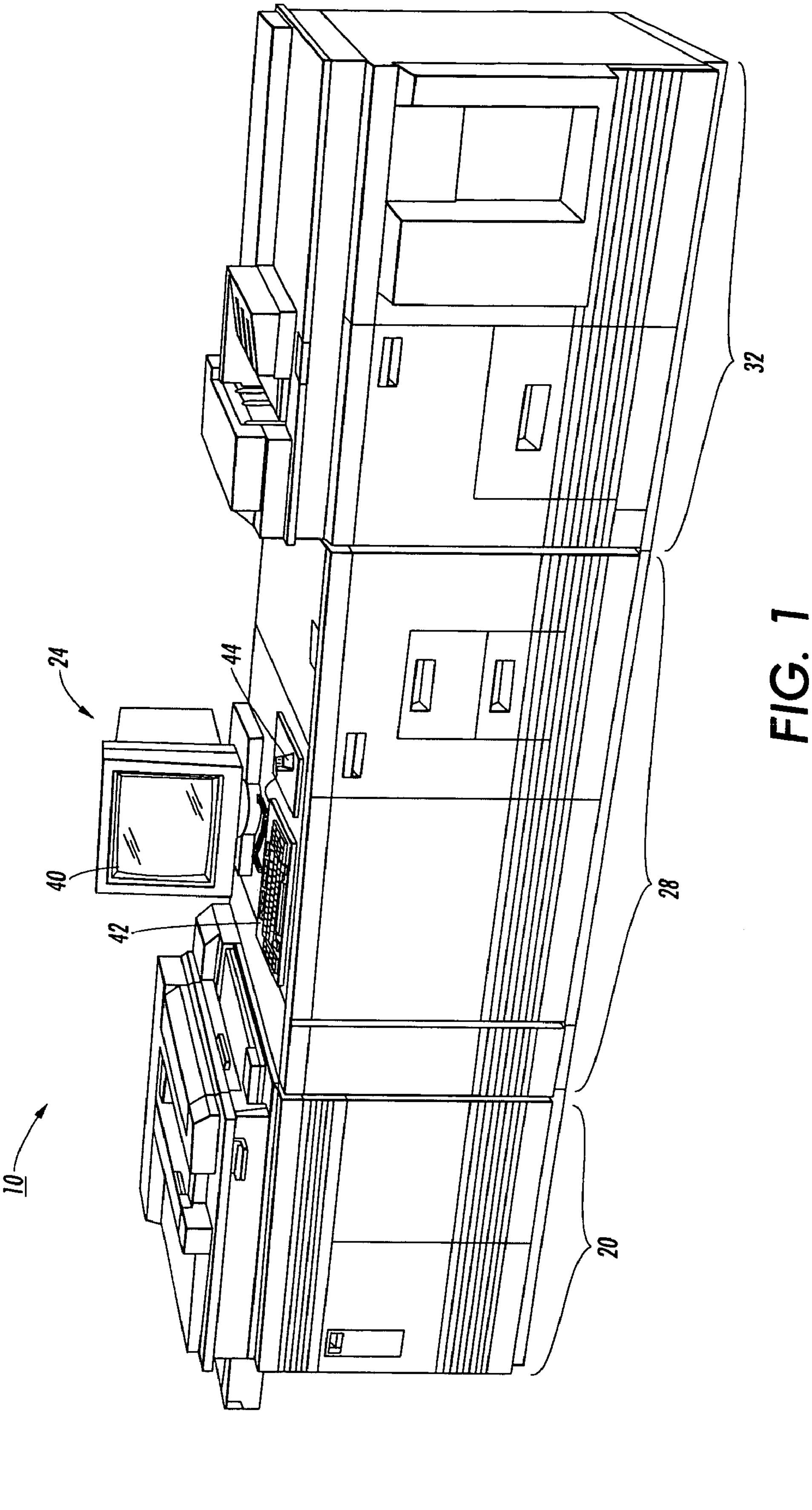
FIG. 1 is an exemplary reprographic/printing system suitable for implementation of the disclosed system and method.

The system and method will be described in connection with a preferred embodiment, however, it will be understood that there is no intent to limit the system and method to the embodiment described. On the contrary, the intent is to cover all alternatives, modifications, and equivalents as may be included within the spirit and scope of the appended claims.

For a general understanding of the system and method, reference is made to the drawings. In the drawings, like reference numerals have been used throughout to designate identical elements.

Referring briefly to FIG. 1, depicted therein is a suitable embodiment for the system and method described herein. More specifically, FIG. 1 illustrates a multipurpose device 10, suitable for producing printed output in response to a plurality of inputs such as original hardcopy documents, image print data and the like. As illustrated, although alternative arrangements are also possible, the system 10 includes an input subsystem 20, a processor and image storage subsystem 24, an electrophotographic imaging and development subsystem 28, and an output and finishing subsystem 32. It will be appreciated that the various components of the multipurpose device 10 may be individual components or subsystems, as illustrated in FIG. 1 that are designed and intended to work together as a cohesive unit. In an alternative configuration, however, the various components and subsystems may be any assembly of well-known components suitable for performing the functions described. The disclosure is not intended to be limited to the embodiment depicted in FIG. 1.

As will be appreciated the multipurpose device may include, as part of the processor and storage subsystem, a network or similar connection by which printing jobs may be submitted for processing and output. The purpose of the processor and storage subsystem 24 is not only the control and operation of the device 10, but also the coordination and control of jobs submitted via a network or by a user employing the user interface comprising display 40, keyboard 42 and mouse 44. Subsystem 24 further includes a processor, or perhaps several processors which operate, based upon a set of preprogrammed instructions stored in a memory, to control the operation of device 10, and to store and process image data within the device to produce hard-copy output in response to such image data. Moreover, as will be appreciated, the input image data may be print data received via a network connection (not shown) or scanned image data derived from the input subsystem 20. Upon submission of a printing or reprographic job, the system operates to complete a series of pre-programmed tasks within the imaging and development subsystem 28, where the desired image is exposed using a laser or similar exposure mechanism on a charged photoresponsive member, is subsequently developed, and then transferred and fused or fixed to print media such as cut sheet paper, as is well-known in the printing arts. As noted above, however, the imaging and development subsystems are not without the ability to cause or perpetuate defects in the imaging and output processes. Hence, the method and system described herein for the automated, real-time detection or recognition of such defects and the reporting or characterization of such defects for resolution.

To accomplish the desired defect recognition and identification, the following disclosure describes placing a full-width scanner within the imaging and development subsystem 28 to analyze the printed images continuously. The scanned image would be compared to an input image, and print quality defects including streaks would be identified, using pattern recognition or similar techniques. Serious defects would halt the printing process, thereby reducing the number of defective prints. To accomplish such a function, the defect scanning system would need to be able to compare the input image (i.e., the image generated by the raster output scanner (ROS) for development to the scanned image (i.e., the image scanned by the defect scanning device). By comparing the two, print defects such as fiber- and debris-related streaks could be identified. Other print defects may also be distinguishable using such a system.

Figure 2:
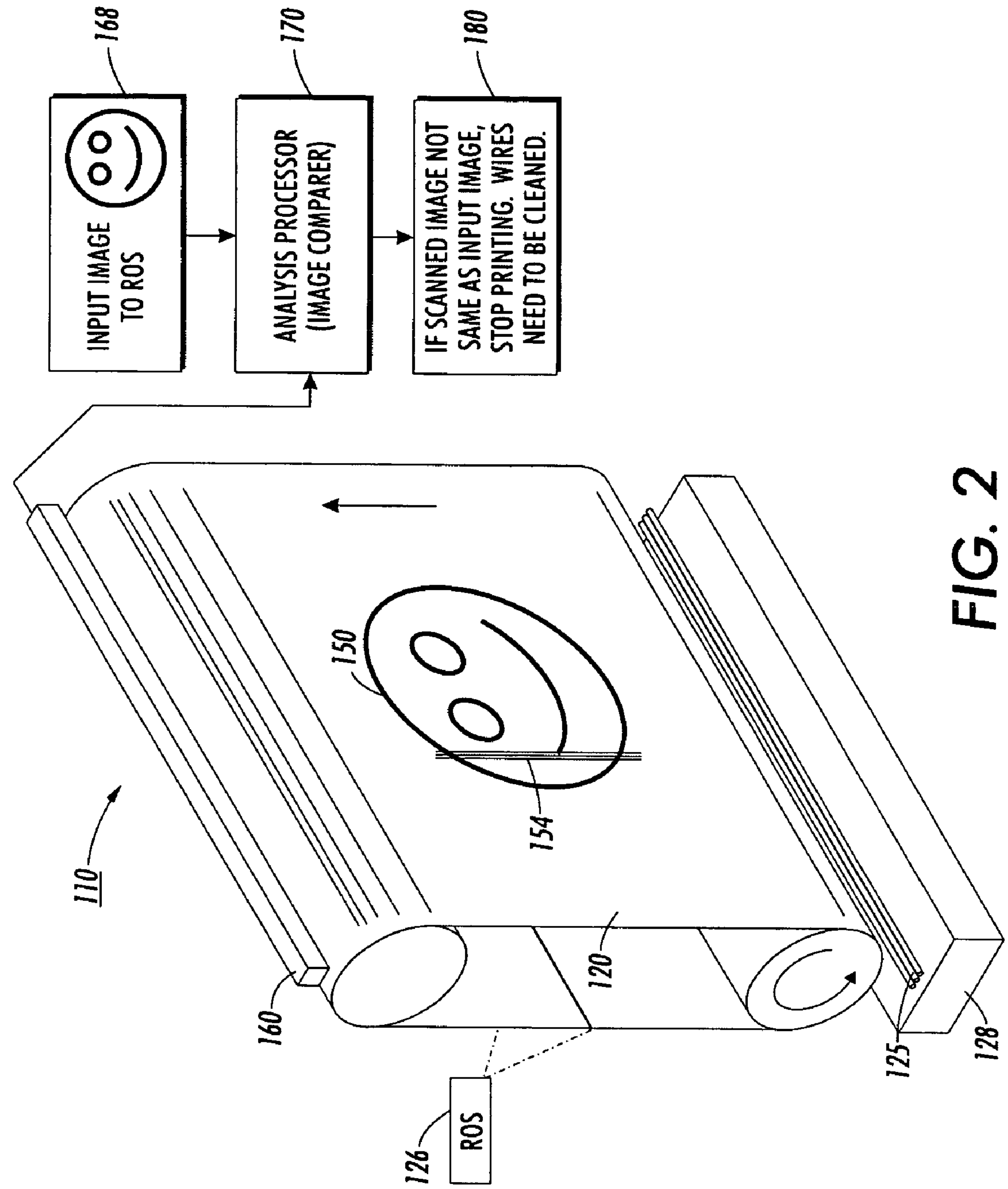
FIGS. 2 and 3 are illustrative examples of alternative embodiments of the system disclosed herein.

Having described an embodiment and general nature of the system and method for automated, real-time defect recognition, attention is now turned to further details associated with such systems and methods. Referring to FIG. 2, there is illustrated a subset of the elements in subsystem 28. More specifically, there is illustrated a system 110 for the automated detection of printing defects in an image output device such as a ROS. The system 110, comprises a photoresponsive member 120 upon which a latent electrostatic image (not shown) has been exposed created in response to an input image (scanned original or print submission) and raster scanning via raster scanning subsystem 126. The process of creating a latent electrostatic image on a photoresponsive member is well known to those familiar with xerography. A development system 128, such as a hybrid scavengeless development (HSD) subsystem is also provided for development of the latent electrostatic image on the photoresponsive member with a marking material such as toner of at least one color to produce a developed image 150 for transfer to a substrate (not shown). Also included is a scanning array 160, disposed adjacent to the photoresponsive member 120, for receiving light reflected from the surface of the photoresponsive member and the marking material and generating a plurality of scanned image signals representative thereof.

As further depicted in FIG. 2, an analysis processor (image comparer) 170 is employed for analyzing the scanned image signals from the scanning array 160 to identify defects in the developed image. It will be appreciated that the image comparer 170 may be any suitable processing device and may be implemented with existing processing capability within the device 10. Alternatively, the comparer may employ dedicated processing functionality and dedicated memory in order to facilitate the real-time processing and analysis of the various image signals.

As illustrated in FIG. 2, the image comparer provides means for analyzing the scanned image signals. The embodiment of FIG. 2 contemplates a memory 168 or similar device for storing at least a portion of the input image data for analysis by the image comparer. In a one-to-one image comparison, artifacts or defects such as line or streak 154, would be detected by the image comparer as the marked region would be detected by scanning array 160, but corresponding image signals would not be found in the input image. As a result, a signal such as signal 180 would be generated to signal the recognition or detection of an image defect, and a particular resolution of the problem may also be indicated. As illustrated by signal 180, the signal may be used to stop printing and/or further indicate that the wires 125 within the hybrid scavengeless development (HSD) system 128 need to be cleaned or replaced.

Hence, the embodiment of FIG. 2 contemplates a processor (image comparer) 170 for comparing the input image to the scanned image signals to identify inconsistencies therein as possible defects in the output image, and circuitry or similar means for generating, in response to the identification of a defect, a defect signal 180.

Although the comparison operation may be performed for each output image, it is also conceivable that to do so would be impossible to do at standard image output rates. Thus, the present invention further contemplates a control function wherein the image comparison step would be executed only once for every N output images (e.g., every tenth or hundredth image). An even simpler alternative, from a processing complexity perspective, is depicted in FIG. 3.

Figure 3:
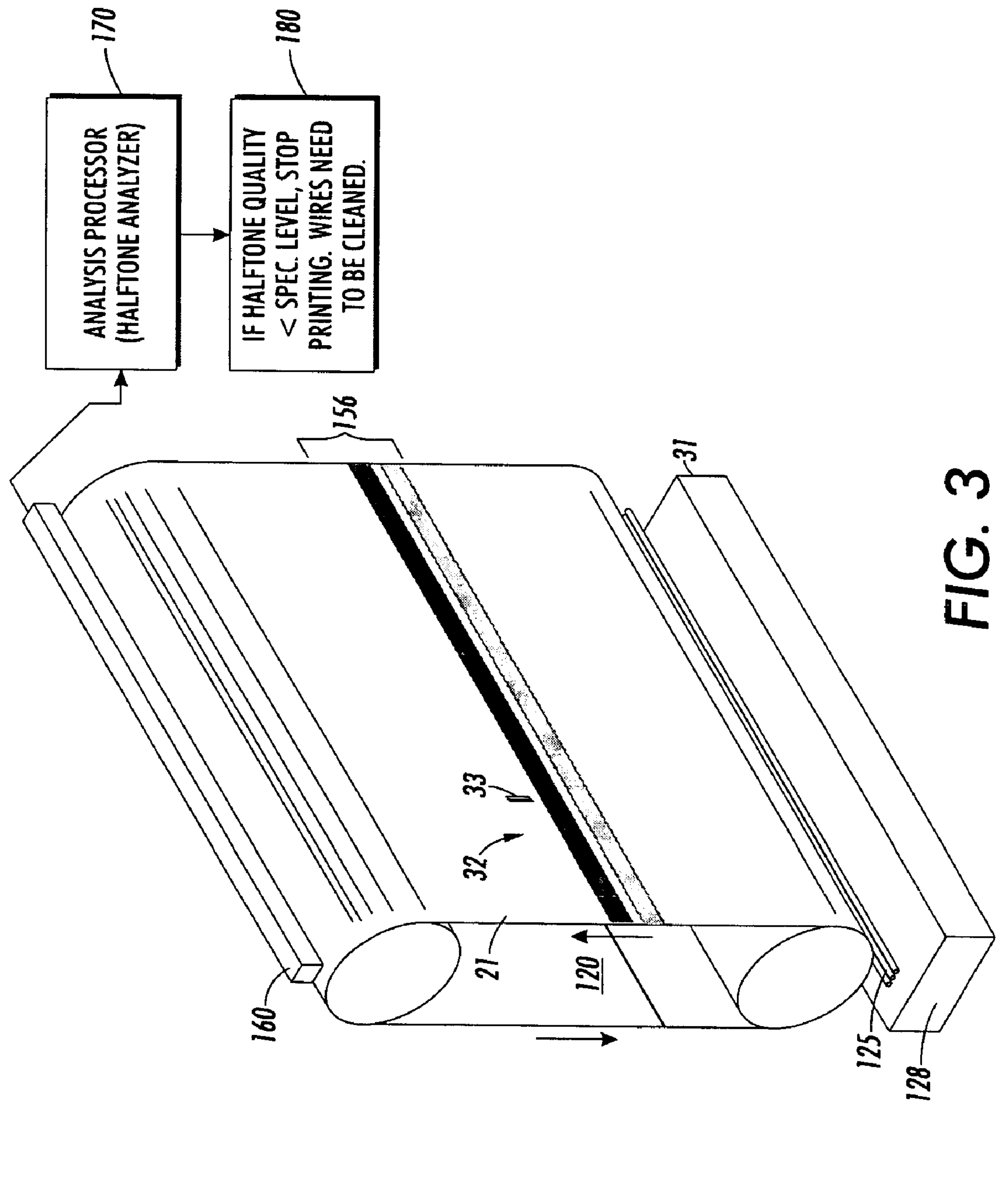

Referring also to FIG. 3, there is illustrated a variation of the system of FIG. 2, designed to print diagnostic patches across the width of the photoresponsive member 120, and to have the scanner analyze only these diagnostic patches. This would significantly reduce the computational requirements of such a system, since it would not need to compare a variable input image to the final image. Hence, the system would include a memory 168 for storing data describing at least one defect pattern and a processor for analyzing the scanned image signals to compare the defect pattern against the scanned image signals to identify a defect within the scanned image signals. Again, the system would include some means for generating, in response to the identification of a defect, a defect signal such as 180. As represented in FIG. 3, the input image is a system generated image intended to provide a continuous-tone output, which is printed in an inter-page region 156 on the photoresponsive member, so as not to interfere with image output or throughput. More specifically, the system that would use halftone regions or bars printed across the width of the photoreceptor in region 156. The defect detection system would then only have to compare the density of the halftone against a standard density, or perhaps, against the average density across the entire bar. In either case, the printed image would not be needed for analysis and detection of a defect, making the system simpler.

As described above relative to FIGS. 2 and 3, the system is capable of generating an image using scanning array 160. It will be further appreciated, however, that the individual elements or pixels of array 160 are responsive to light reflected off of or transmitted through the photoresponsive member 120. In order to produce a reflected light response, it is contemplated that array 160 also includes an illumination or light source for providing the light reflected from the surface of the photoresponsive member. For example, light source may be an incandescent or light-emitting diode source, suitably arranged so as to provide a source of light that impinges on the surface of the photoresponsive member and is reflected from the undeveloped surface of the member, necessitating an "inversion" of the image data prior to comparison. It is also conceivable that the toner or marking material is reflective and it is the toner that is sensed for comparison. The present invention further contemplates that the light source employed may need to be one having a wavelength for which the photoresponsive is not sensitive or has reduced sensitivity so as to prevent the light source from interrupting the charge pattern and developed image on the surface thereof. For example, the light source may be an infra-red source, with suitable sensors in the array.

Figure 4:
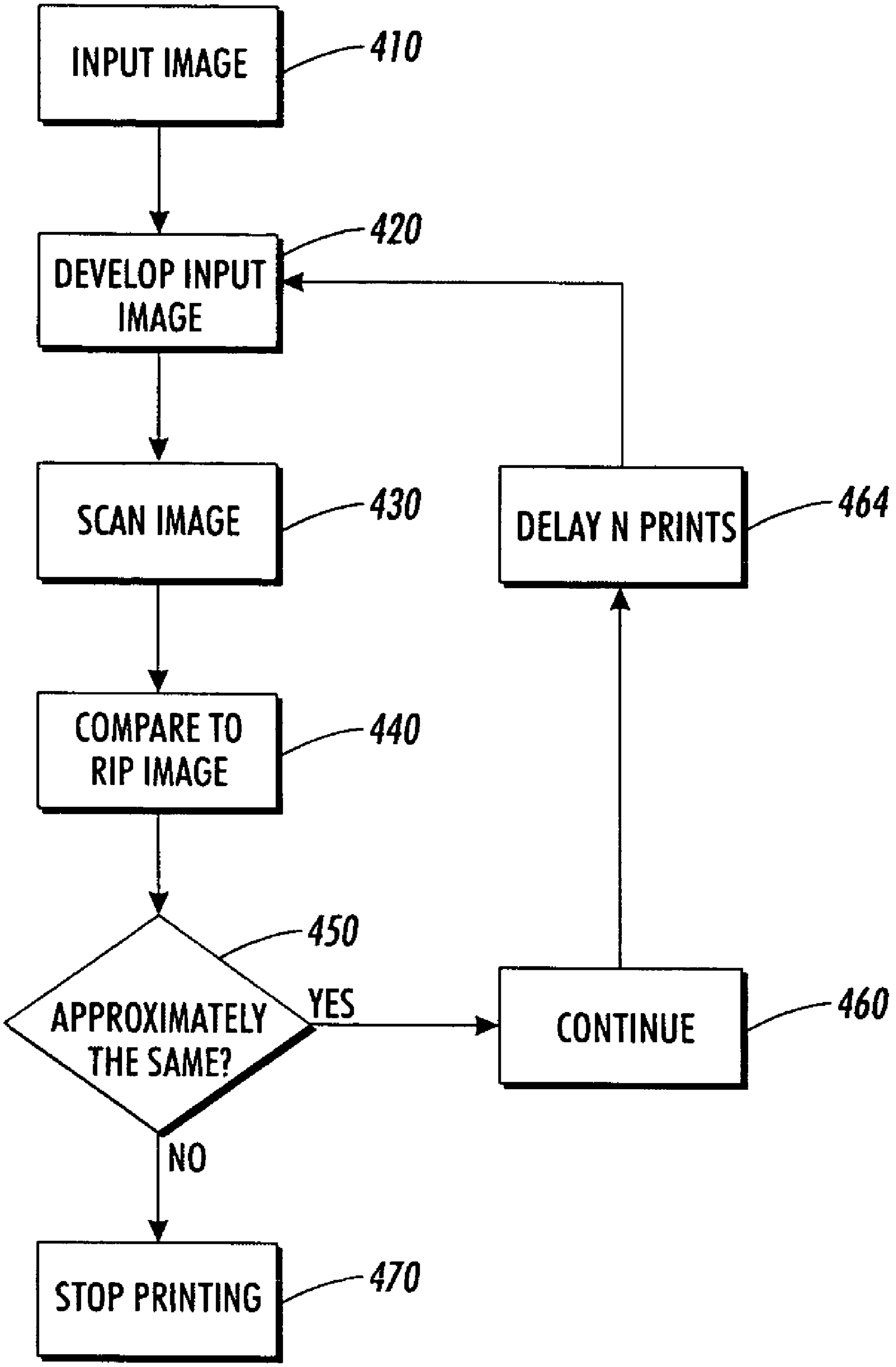
FIG. 4 is a flowchart illustrating the various steps in the method described in detail below.

Considering FIG. 4, depicted therein is a general flowchart for the method carried out by the system described above. In particular, the method for the automated detection of printing defects in an image output device, includes the steps of first receiving an input image (printing data, continuous tone band/region, etc.) as represented by step 410, and then exposing a latent electrostatic image and developing, on a photoresponsive member, the image for transfer to a substrate, step 420. Next, as represented at step 430, the photoresponsive member is scanned for at least a portion of the developed image as the photoresponsive member moves relative to a scanning array, to generate a plurality of scanned image signals representative thereof. Subsequently, analyzing the scanned image signals to identify defects in the developed image at steps 440 and 450. As will be appreciated, the step of scanning the photoresponsive member includes collecting, over a period of time, a series of signals from a scanning array in response to a characteristic of light reflected from the surface of the photoresponsive member. Moreover, due to the possible inherent alignment and related scanning perturbations, the comparison at step 450 may be more of an approximate or "fuzzy" comparison where a certain level of difference between the images being compared is acceptable or within the "tolerance" or "threshold" of the comparison method.

As illustrated by step 460, if the comparison indicates that the images are the "same" (or the average gray level is as expected), the process continues at step 460 and the scan is repeated every N images as indicated by step 464. In the event the comparison is not the same, a signal is generated and printing stops at step 470. Furthermore, as will be appreciated the scanned image characteristic is the intensity of reflected (or transmitted) light, wherein the intensity of the light impinging on the sensor array is a function of the amount of a marking material on the surface of the photoresponsive member.

Having described the general method, attention is turned again to step 450. The step of analyzing the scanned image signals to determine if they are approximately the same, or recognize defects in the developed image, further includes the steps of storing at least a portion of an input image data in memory, and then comparing the input image to the scanned image signals to identify inconsistencies therein as possible defects in the output image. It will be appreciated that some amount of memory will be required to permit storage and comparison of the input image data and the scanned image data.

In the alternative embodiments described with respect to the system of FIG. 3, the step of analyzing the scanned image signals to identify defects in the developed image further includes analyzing the scanned image signals to compare at least one defect pattern against the scanned image signals to identify a defect within the scanned image signals. Here again, the method would either continue if successful, or would generate a defect signal in response to the identification of a defect. As another alternative, the system may automatically generate the input image at step 410 as a continuous-tone image, and print the continuous-tone image in an inter-page region on the photoresponsive member, so as not to interfere with page throughput of the device.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A system for the automated detection of printing defects in an image output device, comprising:

a photoresponsive member upon which a latent electrostatic image is created in response to an input image;

a development system for development of the latent electrostatic image on the photoresponsive member with a marking material of at least one color to produce a developed image for transfer to a substrate;

a scanning array, disposed adjacent to the photoresponsive member, for scanning the developed image and thereby receiving light reflected from the surface of the photoresponsive member and the marking material and generating a plurality of scanned image signals representative thereof; and an image comparer for analyzing the scanned image signals to identify defects in the developed image.

2. The system of claim 1, wherein the image comparer includes:

memory for storing at least a portion of the input image data;

a processor for comparing the input image to the scanned image signals to identify inconsistencies therein as possible defects in the output image; and said processor generating, in response to the identification of a defect, a defect signal.

3. The system of claim 1, wherein the image comparer includes:

a memory for storing data describing at least one defect pattern;

a processor for analyzing the scanned image signals to compare the at least one defect pattern against the scanned image signals to identify a defect within the scanned image signals; and said processor generating, in response to the identification of a defect, a defect signal.

4. The system of claim 1, wherein the input image is a system generated image intended to provide a continuous-tone output, which is printed in an inter-page region on the photoresponsive member, so as not to interfere with image output.

5. The system of claim 1, further including a light source for providing the light reflected from the surface of the photoresponsive member.

6. The system of claim 5, wherein said light source produces, and the scanning array is responsive to, light in a spectrum range in which said photoconductive member is unresponsive.

7. A method for the automated detection of printing defects in an image output device, comprising the steps of:

developing, on a photoresponsive member, in response to a latent electrostatic image, a developed image for transfer to a substrate;

scanning the photoresponsive member for at least a portion of the developed image as the photoresponsive member moves relative to a scanning position, to generate a plurality of scanned image signals representative of at least the portion of the developed image; and analyzing the scanned image signals to identify defects in the developed image.

8. The method of claim 7, wherein said step of scanning the photoresponsive member includes collecting, over a period of time, a series of signals from a scanning array in response to a characteristic of light reflected from the surface of the photoresponsive member.

9. The method of claim 8, wherein the characteristic is the intensity of light, and where the intensity of the reflected light is a function of the amount of a marking material on the surface of the photoresponsive member.

10. The method of claim 7, wherein the step of analyzing the scanned image signals to identify defects in the developed image further includes the steps of:

storing at least a portion of an input image data in memory;

comparing the input image to the scanned image signals to identify inconsistencies therein as possible defects in the output image; and generating, in response to the identification of a defect, a defect signal.

11. The method of claim 7, wherein the step of analyzing the scanned image signals to identify defects in the developed image further includes the steps of:

storing, in memory, data describing at least one defect pattern;

analyzing the scanned image signals to compare the at least one defect pattern against the scanned image signals to identify a defect within the scanned image signals; and generating, in response to the identification of a defect, a defect signal.

12. The method of claim 10, wherein the step of analyzing the scanned image signals to identify defects in the developed image further includes the steps of:

automatically generating the input image as a continuous-tone image; and printing the continuous-tone image in an inter-page region on the photoresponsive member, so as not to interfere with page throughput of the device.

13. The method of claim 10, wherein the step of analyzing the scanned image signals to identify defects in the developed image further includes the step of detecting streaks in the process direction that are indicative of an image defect caused by a problem in the development system.

14. The method of claim 7, further including the steps of:

delaying a predefined number of prints; and subsequently repeating all steps to detect any printing defects.

15. The method of claim 12, wherein the step of analyzing the scanned image signals to identify defects in the developed image produced in the inter-page region further includes the step of detecting streaks in the process direction that are indicative of an image defect caused by a problem in the development system.

16. A multipurpose imaging device suitable for producing printed output in response to an input, comprising:

an input subsystem;

a processor and image storage subsystem;

an electrophotographic imaging and development subsystem including a photoresponsive member upon which a latent electrostatic image is created in response to an input image;

an output and finishing subsystem including a development system for development of the latent electrostatic image on the photoresponsive member with a marking material to produce a developed image for transfer to a substrate;

a scanning array, disposed adjacent to the photoresponsive member and after the development subsystem, for receiving light reflected from the surface of the photoresponsive member and the marking material developed thereon and generating a plurality of scanned image signals representative thereof; and an image comparer for analyzing the scanned image signals relative to the input image to identify defects in the developed image.

17. The system of claim 16, wherein the image comparer includes:

memory for storing at least a portion of the input image;

a processor for comparing the input image to the scanned image signals to identify inconsistencies therein as possible defects in the output image; and said processor generating, in response to the identification of a defect, a defect signal.

18. The system of claim 16, wherein the input image is a system generated image providing a continuous-tone output, and is exposed and developed in an inter-page region on the photoresponsive member, so as not to interfere with image output.

19. The system of claim 16, further including a light source for providing the light reflected from the surface of the photoresponsive member.

20. The system of claim 19, wherein said light source produces, and the scanning array is responsive to, light in a spectrum range in which said photoconductive member is not responsive.

* * * * *